United States Patent
Foland, Jr. et al.

(10) Patent No.: US 8,705,330 B1
(45) Date of Patent: Apr. 22, 2014

(54) METHOD AND SYSTEM FOR FAULT PROTECTION USING A LINEAR FEEDBACK SHIFT REGISTER

(71) Applicant: Marvell International Ltd., Hamilton (BM)

(72) Inventors: William R. Foland, Jr., Golden, CO (US); Eric A. Richards, Broomfield, CO (US); Christopher L. Painter, Longmont, CO (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/053,502

(22) Filed: Oct. 14, 2013

Related U.S. Application Data (63) Continuation of application No. 12/143,564, filed on Jun. 20, 2008, now Pat. No. 8,559,287.

(60) Provisional application No. 60/950,217, filed on Jul. 17, 2007.

(51) Int. Cl.
*G11B 11/00* (2006.01)

(52) U.S. Cl.
USPC .................................. 369/53.26; 369/53.38

(58) Field of Classification Search
None
See application file for complete search history.

(56) References Cited

U.S. PATENT DOCUMENTS

| | | |
|---|---|---|
| 5,155,779 A | 10/1992 | Avramopoulos et al. |
| 5,208,705 A | 5/1993 | Avramopoulos et al. |
| 5,428,630 A | 6/1995 | Weng et al. |
| 8,559,287 B1 | 10/2013 | Foland, Jr. |

OTHER PUBLICATIONS

"Ex Parte Quayle Action", U.S. Appl. No. 12/143,564, Mar. 14, 2013, 4 Pages.
"Notice of Allowance", U.S. Appl. No. 12/143,564, Jun. 14, 2013, 7 pages.
"Restriction Requirement", U.S. Appl. No. 12/143,564, Oct. 15, 2012, 5 pages.

*Primary Examiner* — Paul Huber (57) ABSTRACT

A method, system and apparatus for fault protection using a linear feedback shift register are presented. The system comprises a protected register containing a first portion for holding a value for a sequence of numbers and a second portion for other parameters. The system also comprises a linear feedback shift register circuit configured to write the sequence of numbers to the first portion of the protected register. If the written sequence of numbers of the protected register matches a reference sequence of numbers, a rewrite circuit is configured to write the second portion of the protected register.

20 Claims, 8 Drawing Sheets

```
int main (void)

// for N = 4, the period of the sequence is 2^4 – 1 = 15.  To
// demonstrate this, we calculate and print two periods of the
// sequence.

#define PERIOD 15
#define NUM_PERIODS 2
#define SEED 3 // initial LFSR state; must be an integer from the set //
               //  {1,2,3, . . ., 15}

{
    short k, x, x0, x3, new_x0;

//  To emulate the operation of an actual hardware LFSR, we use the
    //  lower 4 bits of a 2 byte integer (short).  The higher order bits
    //  are unimportant.

x = SEED;

for (k=0; k<NUM_PERIODS*PERIOD; k++) {
        printf ("%x ", x & 0x000f); // print only the lower 4 bits
        if ((k+1) % PERIOD == 0)
            printf ("\n");
        x3 = x & 8 ? 1 : 0;        // bit 3
        x0 = x & 1 ? 1 : 0;        // bit 0
        new_x0 = x3 ^ x0;          // feedback term
        x = (x << 1) | new_x0;     // update the LFSR
    }
    return;
}
```

FIG. 10

METHOD AND SYSTEM FOR FAULT PROTECTION USING A LINEAR FEEDBACK SHIFT REGISTER

RELATED APPLICATION

The present application is a continuation of U.S. Utility application Ser. No. 12/143,564, filed Jun. 20, 2008, which claims priority to U.S. Provisional App. No. 60/950,217, filed Jul. 17, 2007, the contents of which are incorporated herein by reference in their entirety.

BACKGROUND

The present disclosure relates generally to a fault protection mechanism. More specifically, the present disclosure relates to methods and systems for fault protection using a linear feedback shift register.

Modern devices can be susceptible to fault conditions, which may result in component and system damage. For example, during a drive operation of an optical drive such as a CD player, a CD/DVD combo player, a HD DVD player, or a Blu-ray player, the laser read power must be kept below a threshold, above which damage could occur to the laser. If the laser read power exceeds the threshold, the read laser may be damaged.

Typically, each device has built-in safety protection. In the above example, an optical drive typically includes an automatic power control loop. In addition, an optical drive may include a mechanism to shut down the read laser when the laser read power exceeds the threshold. The automatic power control loop can be disabled by an analog comparator circuit that continuously compares a forward sense voltage to the threshold. If the comparator detects a laser fault condition, the laser is automatically powered down, and an interrupt request is issued to notify device firmware of the fault condition.

However, a problem arises if a computer chip controlling the protection comparator erroneously sets the threshold to an inappropriate value. As a result, the device's built-in safety protection may not be invoked, even though the device is operating at an unsafe power level, because the power is under the erroneously-set threshold.

Moreover, the widespread use of firmware makes devices more susceptible to fault conditions. Firmware is a computer program embedded in a hardware component such as a microcontroller. A user may upload firmware onto existing hardware and update the firmware after the device is manufactured, either electronically, or by replacing a storage medium such as a socketed memory chip.

In optical drives, for example, built-in safety protection, such as an automatic power control loop, may typically be implemented in firmware. Therefore, it is conceivable that a laser fault condition could result if the firmware erroneously writes an inappropriate value to one or more of the register fields that determine the value of the current sent to the laser diode driver (LDD). One reason for this potential occurrence is a general firmware failure condition so severe as to require a power-on reset. Less severe firmware error conditions are also possible.

Notwithstanding any firmware errors, CPU failure, clocking errors, or other unexpected errors, the device must have a fault protection mechanism to protect the integrity of the threshold field. For example, in an optical drive, once the forward sense threshold value and other protected parameters have been set, the firmware cannot re-program them during normal drive operation, and the parameters may not be overwritten by other means. The parameters are thus protected in the sense that they may be programmed only once after each power-on operation.

Accordingly, it would be desirable to have additional methods and systems for fault protection using a linear feedback shift register.

SUMMARY

Consistent with principles of the invention, methods, systems and apparatuses for fault protection using a linear feedback shift register are presented. In one embodiment, a system comprises a protected register containing a first portion for holding a value for a sequence of numbers and a second portion for other parameters. The system also comprises a linear feedback shift register circuit configured to write the sequence of numbers to the first portion of the protected register. If the written sequence of numbers of the protected register matches a reference sequence of numbers, a rewrite circuit is configured to write the second portion of the protected register.

In another embodiment, a method for fault protection is provided. The method comprises performing a linear feedback shift register test using a protected register and writing at least one portion of the protected register if the linear feedback shift register test is successful. The linear feedback shift register test comprises generating a sequence of numbers, writing the generated sequence of numbers to the protected register, and providing a reference sequence of numbers. The outcome of the linear feedback shift register test is determined by comparing the generated sequence of numbers with the reference sequence of numbers. If the generated sequence of numbers matches the reference sequence of numbers, the linear feedback shift register test is considered successful.

In yet another embodiment, a method for changing a hardware parameter is provided. The method comprises generating a first sequence of numbers, initializing a reference sequence of numbers, writing the first sequence of numbers to a first portion of a protected register, and comparing the first sequence of numbers with the reference sequence of numbers. If the first sequence of numbers matches the reference sequence of numbers, write access to a second portion of the protected register is authorized.

It is to be understood that both the foregoing general description and the following detailed description are exemplary and explanatory only and are not restrictive of the invention as claimed.

The accompanying drawings, which are incorporated in and constitute a part of this specification, illustrate aspects of the disclosure and, together with the description, serve to explain the principles of the disclosure.

DETAILED DESCRIPTION

Reference will now be made in detail to the present aspects of the disclosure, examples of which are illustrated in the accompanying drawings. Wherever possible, the same reference numbers will be used throughout the drawings to refer to the same or like parts.

Figure 1:
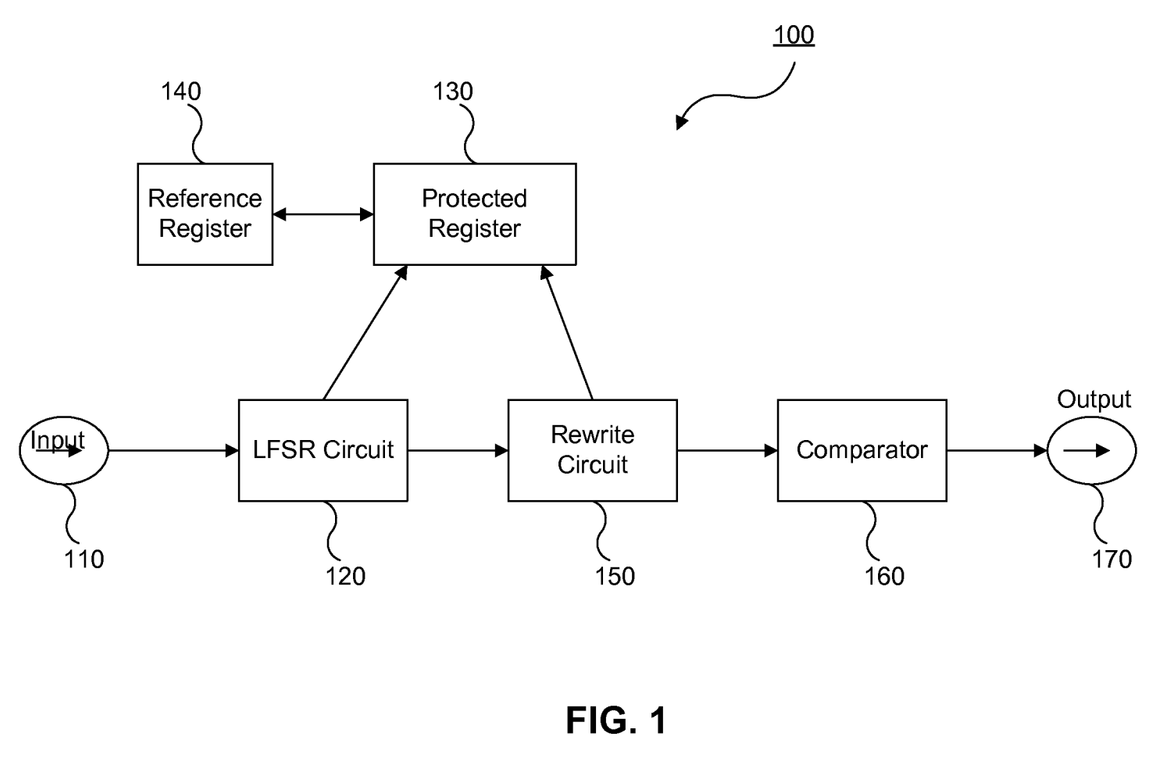
FIG. 1 is a block diagram showing a fault protection circuit, consistent with the present disclosure.

FIG. 1 is a block diagram showing a fault protection circuit 100. In this embodiment, fault protection circuit 100 includes a current input 110, a linear feedback shift register (LFSR) circuit 120, a protected register 130, a reference register 140, a rewrite circuit 150, a comparator 160 and a current output 170.

A LFSR is a circuit that generates a pseudorandom binary sequence corresponding to a sequenced binary bit stream using linear feedback. Consistent with the present disclosure, LFSRs and related logic may form a mechanism to restrict faulty access to protected hardware parameters.

In one embodiment, LFSR circuit 120 can be a hardware implementation of abstract algebra concepts. In particular, the input of a length-N shift register includes a linear combination of the current contents of the shift register. All arithmetic is performed modulo-2. In hardware, LFSR circuit 120 may be implemented using one or more XOR gates. In an example where N=4, only one XOR gate is required. As the LFSR continues to be updated, it produces a periodic sequence of N-bit values. If the LFSR feedback topology has been chosen properly, the period of this sequence will be $2^N-1$. A sequence having this length ($2^N-1$) is called a maximal length sequence.

Although LFSR circuit 120 can be a hardware implementation, other implementations are possible. For example, LFSR circuit 120 may be implemented through software emulations in firmware.

The LFSR topology can be described by a polynomial. A polynomial that results in a maximal length sequence is called a primitive polynomial. LFSR circuit 120 may, for example, use a primitive polynomial where N=4:

$$f(x)=x^4+x+1 \quad \text{Equation (1)}.$$

The initial state of the LFSR is called the "seed." Any N-bit seed value is permissible, except all zeros. Therefore, the LFSR may arbitrarily choose a seed value of:

$$x=[x_3x_2x_1x_0]=[0011]=3 \quad \text{Equation (2)}.$$

The seed value is coded in hardware.

Once LFSR circuit 120 generates a sequence of numbers, starting with the seed value, LFSR circuit 120 writes the sequence of numbers, one at a time, to an LFSR field in protected register 130. The LFSR field in protected register 130, for example, may be the lower bits 3:0.

In one embodiment, the sequence of numbers in the LFSR field of protected register 130 may be compared with a reference sequence of numbers in an LFSR field of reference register 140. The reference sequence of numbers in reference register 140 may be initialized by the same LFSR algorithm as described above, either through a hardware LFSR circuit or an emulated firmware implementation.

The comparison between the sequence of numbers written in protected register 130 and the reference sequence of reference register 140 may be implemented in many ways. In one embodiment, for each of the numbers in the sequence of numbers generated by LFSR circuit 120 and written into LFSR field of protected register 130, that number may be compared with a number in the LFSR field of reference register 140. If the numbers match, LFSR circuit 120 will write the next number in the sequence into the LFSR field of protected register 130, thus overwriting the previous number. The number in the LFSR field of reference register 140 will also be advanced according to the reference sequence.

If LFSR circuit 120 writes the entire sequence of the numbers correctly, protected register 130 is unlocked, so that rewrite circuit 150 will be able to write the protected hardware parameters in protected register 130. The protected hardware parameters include, for example, a power threshold for read laser during drive operation.

At any time a mismatch occurs, however, the comparison process will be aborted, because a failure is considered to have occurred. Therefore, protected register 130 remains locked, and rewrite circuit 150 may not write the protected hardware parameters in protected register 130. Accordingly, the important hardware parameters, such as a read laser power threshold in an optical drive, are protected. For example, the hardware parameters may be programmed only once after each power-on operation. The important hardware parameters, however, may also be protected during normal operation under certain circumstances using the fault protection mechanism consistent with the present disclosure.

In one embodiment, LFSR circuit 120 is a firmware emulation of a hardware LFSR circuit, while reference register 140 is initialized through a hardware LFSR circuit. Both LFSR circuit 120 and rewrite circuit 150 provide write access to protected register 130 using the firmware. Other implementations of fault protection circuit 100 are also possible. In one example, LFSR circuit 120 may encompass the reference register 140 or store the reference sequence of numbers in other hardware locations without necessarily using reference register 140. In another example, the comparison of the sequences may be implemented by comparing more than one number at a time.

During normal operation, comparator 160 compares a characteristic of the system, such as the voltage or current with one of the protected hardware parameters and shuts down the system if the voltage or current exceeds the threshold in the protected hardware parameters. In one embodiment involving an optical pickup unit (OPU) architecture, comparator 160 may be a forward sense comparator that compares a forward sense voltage with a read laser power threshold.

Figure 2:
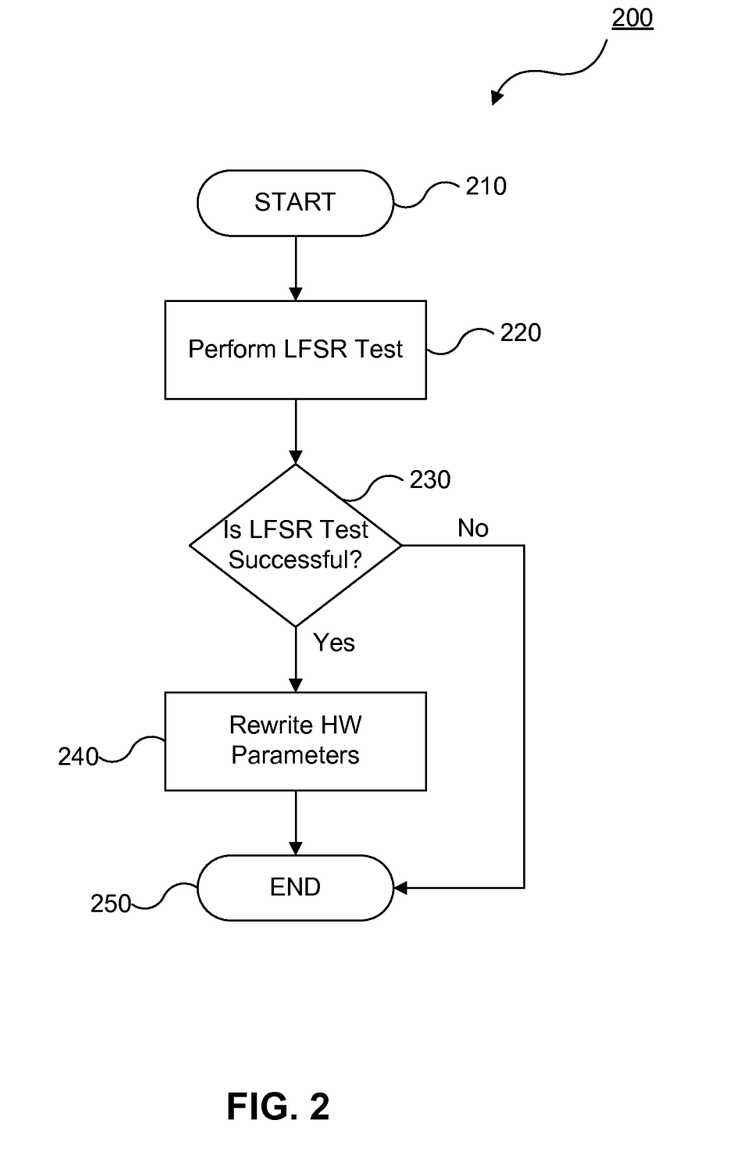
FIG. 2 is a flowchart showing an exemplary method for fault protection using a linear feedback shift register, consistent with the present disclosure.

FIG. 2 is a flowchart showing an exemplary method 200 for fault protection using a linear feedback shift register. In this embodiment, step 210 starts the process to detect any fault conditions. Step 210 may be triggered by a condition such as after each power-on operation. That is, the power-on reset line of the chip must be asserted and then de-asserted.

A fault protection circuit then performs an LFSR test at step 220. In one embodiment, the fault protection circuit generates a sequence of numbers and writes the sequence of numbers, one at a time, to a protected register. The fault protection circuit compares the sequence being written to the protected register with a reference sequence of numbers in hardware. For example, for each of the numbers in the sequence of numbers in the protected register, that number may be compared with a number in the reference sequence of numbers. If the numbers match, the fault protection circuit will write the next number in the sequence to the protected register, and advance the state of the reference sequence of numbers. The fault protection circuit then compares the next number.

In step 230, the fault protection circuit determines whether the LFSR test was successful. If the fault protection circuit writes the entire sequence correctly, that is, if both sequences of numbers match in their entirety, the LFSR test is considered successful. If, however, at any time a mismatch occurs, the LFSR test has failed and the comparison process will be aborted.

Therefore, if the LFSR test is successful, the fault protection circuit performs step 240, where the protected register is unlocked and the protected hardware parameters in the protected register may be written. In one embodiment, after the protected hardware parameters have been set, the fault protection circuit may not re-program them during normal operation, and the values may not be overwritten by other means (step 250).

On the other hand, if the LFSR test fails, the process ends at step 250, where the protected register remains locked, and the protected hardware parameters may not be overwritten by other means.

In one embodiment, exemplary method 200 includes steps of initializing the reference sequence of numbers and storing the reference sequence in a reference register. In another embodiment, exemplary method 200 includes a step of using firmware to write the protected register.

In yet another embodiment, exemplary method 200 includes steps of generating a linear feedback shift register sequence of 4-bit values and/or writing a hardware parameter for a read laser power threshold in an optical drive such as a CD player, a CD/DVD combo player, a HD DVD player, and Blu-ray player. During normal drive operation, if a forward sense voltage exceeds the read laser power threshold, exemplary method 200 further includes a step of shutting down the optical drive.

Figure 3:
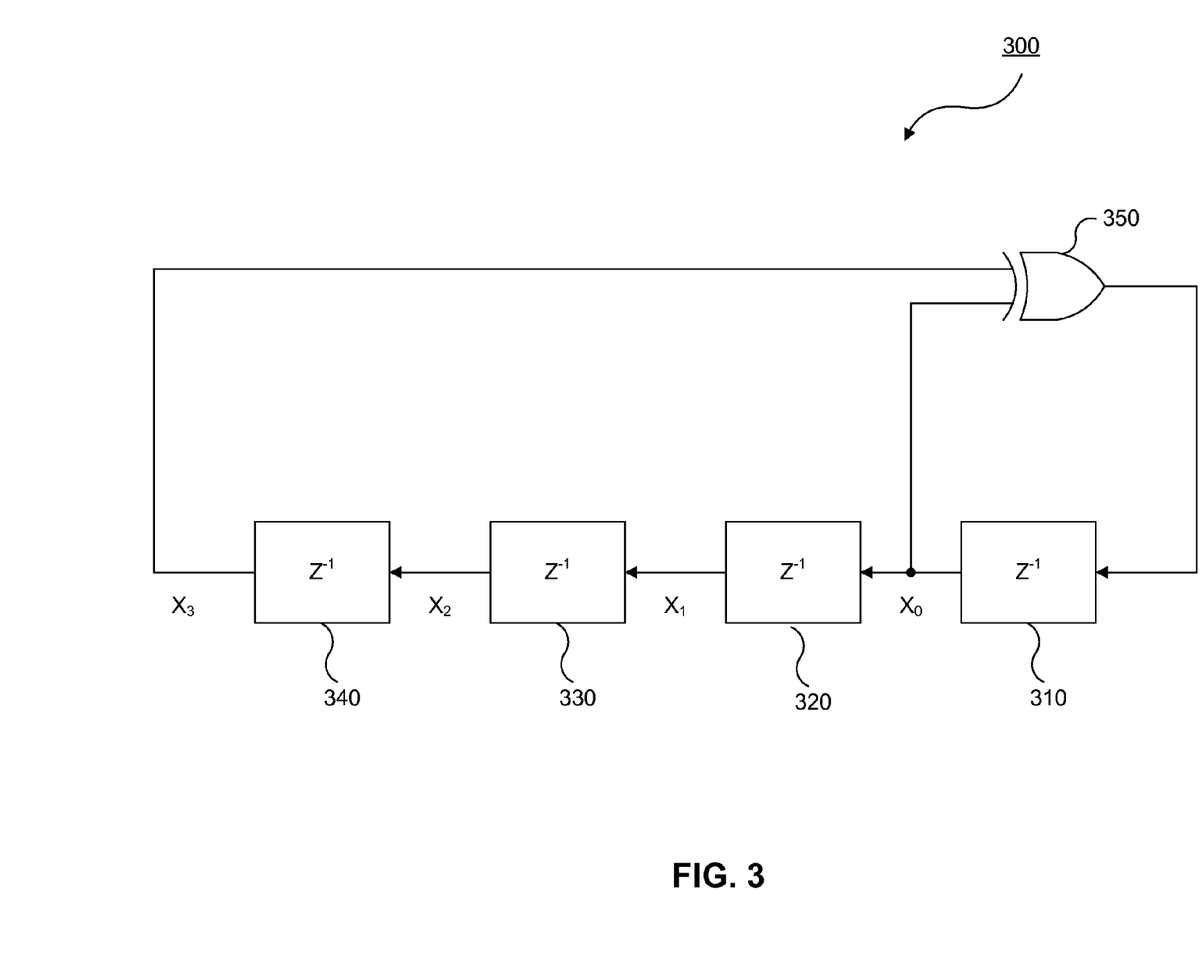
FIG. 3 is a diagram showing a hardware implementation of a linear feedback shift register circuit, consistent with the present disclosure.

FIG. 3 is a diagram showing an LFSR circuit 300 in a hardware implementation. In this embodiment, each number is a 4-bit value (N=4). The primitive polynomial in Equation (1) leads to the hardware structure in LFSR circuit 300.

LFSR circuit 300 includes shifters 310, 320, 330, and 340, corresponding to bits $x_0$, $x_1$, $x_2$, and $x_3$, and an XOR gate 350. In one embodiment, the seed is set to be $x=[x_3 x_2 x_1 x_0]=[0011]=3$, although any 4-bit seed value is permissible except for all zeros. Accordingly, the periodic sequence of 4-bit values produced by LFSR circuit 300 is x={0011, 0111, 1111, 1110, 1101, 1010, 0101, 1011, 0110, 1100, 1001, 0010, 0100, 1000, 0001, . . . }. The period of this sequence is 15.

Figure 4:
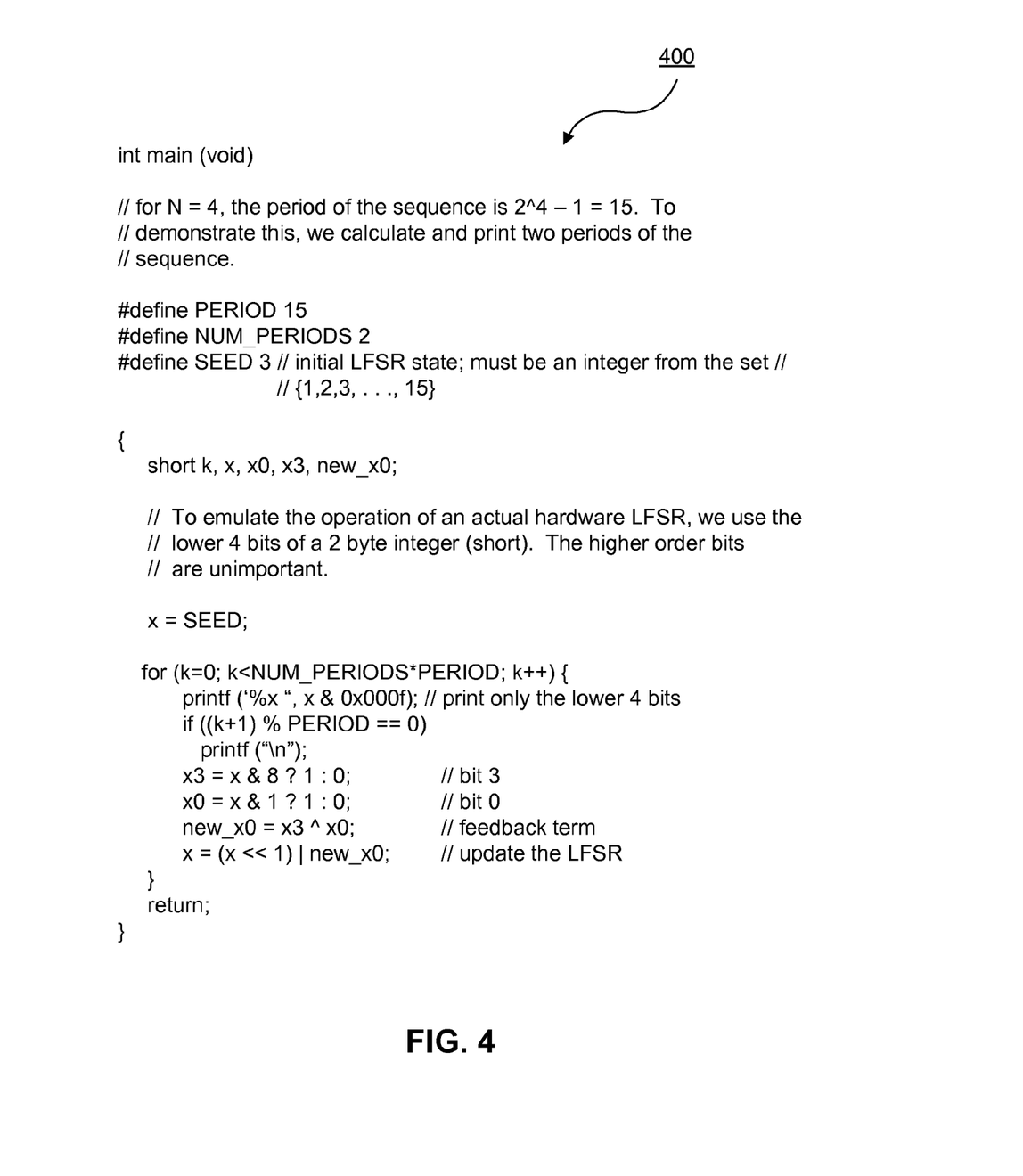
FIG. 4 is an exemplary software code showing software emulation of a linear feedback shift register circuit, consistent with the present disclosure.

FIG. 4 shows an exemplary software code 400 providing software emulation of an LFSR circuit. Exemplary software code 400 emulates the hardware implementation of the above LFSR circuit 300 (see FIG. 3) in software. Other aspects of software implementations of an LFSR circuit are possible, and exemplary software code 400 is provided here for illustrative purposes.

Figure 5:
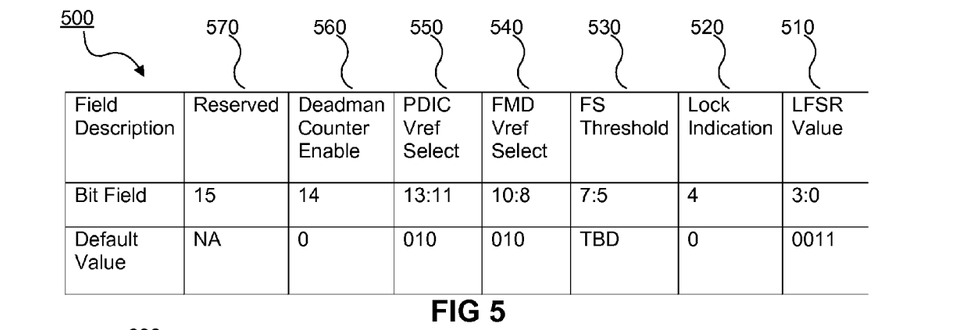
FIG. 5 is a table showing an exemplary laser fault protection register, consistent with the present disclosure.

FIG. 5 is a table showing an exemplary laser fault protection register 500 in an OPU architecture. Register 500 may be an embodiment of protected register 130 in FIG. 1. Referring back to FIG. 5, register 500 includes fields 510 through 570: LFSR Value (field 510), Lock Indication (field 520), Forward Sense (FS) Threshold (field 530), Front Monitor Diode (FMD) Vref Select (field 540), Photo-detector IC (PDIC) Vref Select (field 550), Deadman Counter Enable (field 560), and Reserved (field 570). The bit field and default value for each field are also shown in FIG. 5. For example, field 510 contains the LFSR value occupying the lower three bits of the register (3:0) with a default seed value of [0011]. The default values represent the initial state of laser fault protection register 500.

The descriptions of individual fields are explained next. LFSR Value field 510 may be the portion of the protected register to which LFSR circuit 120 (see FIG. 1) writes the sequence of numbers. Lock Indication field 520 is read only during normal operation and indicates whether the other portions (i.e., higher bits) of register 500 may be written.

To unlock the higher bits of register 500, the firmware must write the correct sequence of fifteen numbers to LFSR Value field 510. After the fifteenth correct value of the sequence is written, the supervisory logic unlocks the higher bits of register 500, allowing the desired parameter values to be written. If at any time an incorrect value is written, that is, the number does not match a corresponding number of a reference sequence, the hardware LFSR that regulates write access is reset and the register remains locked. The handshaking process may then be restarted without asserting the power-on reset line.

Once register 500 has been successfully written, no further writes are permitted unless the conditions are met. Register 500 may be read at any time, and a read operation does not alter the state of the hardware LFSR.

FS Threshold field 530 may be firmware-accessible. In one embodiment involving an OPU architecture, a transimpedance (IN) amplifier that converts a FMD photocurrent into a voltage is included on board the LDD IC. When the LDD IC is powered down, the FS signal is no longer actively driven. Even though there is no current flowing in the laser diode, the difference between the FS voltage and the reference voltage can become larger than the detection threshold, causing a false indication of a fault condition. For this reason, the FS voltage used by the forward sense comparator, such as comparator 160 (see FIG. 1), is referenced to ground, rather than to the reference voltage.

Therefore, this reference voltage may be protected based on the LFSR test mechanism for the LFSR Value. This may prevent any false fault detection that might otherwise occur as a result of an erroneous write to the reference voltage generator that is connected to the FS transimpedance amplifier within the OPU. This safety mechanism may also ensure that the fault detector signals when there is a true fault condition. Both the PD1C and FMD reference generators are protected in this way to ensure the integrity of FMD Vref Select field 540 and PDIC Vref Select field 550. Possibly, the Printed Circuit Board (PCB) designer may interchange the two reference generators.

Deadman Counter Enable field 560 has a default state of 0, indicating that the Deadman Counter is disabled. If field 560 has a state of 1, indicating that the Deadman Counter is enabled, the Deadman Counter may be adapted to count from an initial value, after the power-on reset line of the chip has been de-asserted, to a final value to indicate that the system has failed and the chip should be shut down. In one embodiment, the Deadman Counter counts down from a pre-determined value to zero. Once it goes to zero, the system resets the chip. An LFSR circuit may also enable or disable the Deadman Counter using the Deadman Counter Enable field 560. If enabled, the firmware may reset the value of the Deadman Counter, so that the Deadman Counter does not go to zero unless a fatal system error has occurred. This way, the Deadman Counter will not be accidentally enabled or disabled. Also, the Deadman Counter can be dynamically disabled through the LFSR test mechanism during chip power-down mode to avoid the system being shut down.

In one embodiment, after power-on, but before the threshold register has been programmed, all laser power output is disabled and read-only Lock Indication field 510 is not set. When the higher bits of register 500 are programmed, the read-only Lock Indication field 510 is set to indicate success and becomes read only thereafter. After the higher bits of register 500 have been programmed, if the FS voltage exceeds the programmed FS Threshold value in field 530, the system is disabled immediately. This effectively forces the laser current to zero. In order to re-enable the laser, the power-on reset is required. After a power-on reset, the firmware must conduct the LFSR test, as discussed above. In addition, an interrupt is provided to the processor when laser power output has been disabled due to exceeding the threshold. The firmware can act accordingly by issuing a power-on test.

Figure 6:
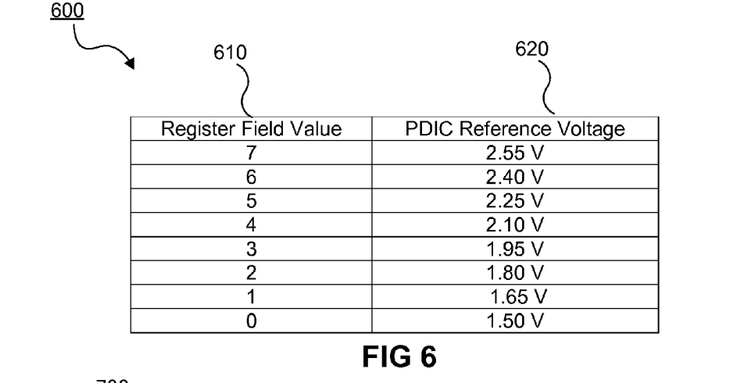
FIG. 6 is a table showing exemplary photo-detector IC voltages, consistent with the present disclosure.
Figure 7:
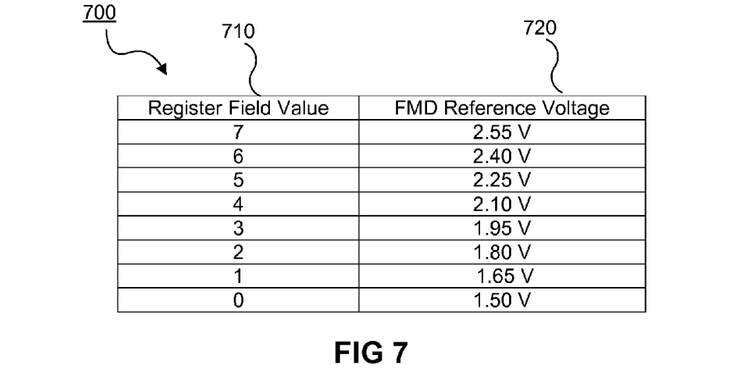
FIG. 7 is a table showing exemplary front monitor diode voltages, consistent with the present disclosure.

FIG. 6 is a table 600 showing exemplary photo-detector IC voltages, while FIG. 7 is a table 700 showing exemplary front monitor diode voltages. In FIG. 6, table 600 includes a field 610 indicating register field values and a field 620 indicating PDIC reference voltages (Vref). For example, if PDIC Vref Select field 550 (see FIG. 5) has a value of 0, the PDIC reference voltage is 1.50 V. Similarly, in FIG. 7, table 700 includes a field 710 indicating register field values and a field 720 indicating FMD reference voltages. For example, if FMD Vref Select field 540 (see FIG. 5) has a value of 0, the FMD reference voltage is 1.50 V.

Figure 8:
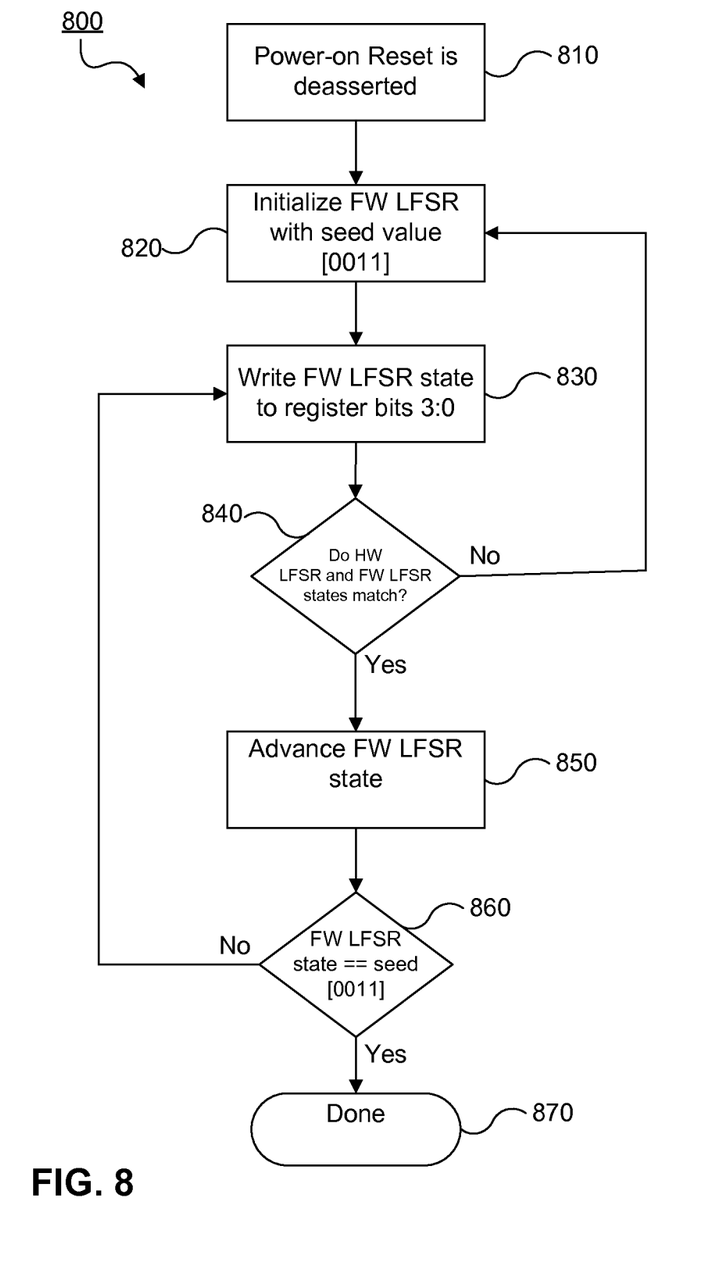
FIG. 8 is a flowchart showing another exemplary method for fault protection using a linear feedback shift register, consistent with the present disclosure.

FIG. 8 is a flowchart showing another exemplary method 800 for fault protection using a linear feedback shift register. Method 800 starts at step 810, after the power-on reset line is asserted and then de-asserted. The fault protection system next initializes a sequence of numbers with a seed value of [0011], using a firmware LFSR circuit, at step 820. The firmware then writes the sequence of numbers, one at a time, to register bits 3:0 (see the field 510 in FIG. 5) in the hardware, at step 830.

At step 840, the fault protection system checks whether the number written by the firmware matches a number from a reference sequence of numbers generated by a hardware LFSR circuit. If there is no match, the fault protection system returns to step 820 and initializes another sequence of numbers with a seed value of [0011], using a firmware LFSR circuit. If there is a match, however, the fault protection system will advance the firmware sequence to the next state at step 850. Also at step 850, the hardware reference sequence will advance automatically when a correct value is written to register bits 3:0 by the firmware.

Any attempts to write to register bits 14:5, such as fields 530 through 570 in FIG. 5, may not be accepted by the hardware until the fifteenth correct number has been written to the hardware by the firmware. The fault protection system continuously checks whether the firmware number equals the seed value [0011] at step 860 throughout the sequence. When there is no match, the fault protection system goes back to step 830 to advance to the next number in the firmware sequence. After the firmware has written the fifteenth correct numbers, the sequence starts again and the firmware number matches the seed value [0011]. This indicates the end of a successful LFSR test. At step 870, the fault protection system unlocks the upper bits of the protected register by setting the Lock Indication field 520 (see FIG. 5) to 1. As a result, the firmware may write the protected parameters, such as a read laser power threshold, in the upper bits of the protected register. Accordingly, during normal operation, the fault protection system may shut down the system if a FS voltage exceeds the read laser power threshold.

Figure 9:
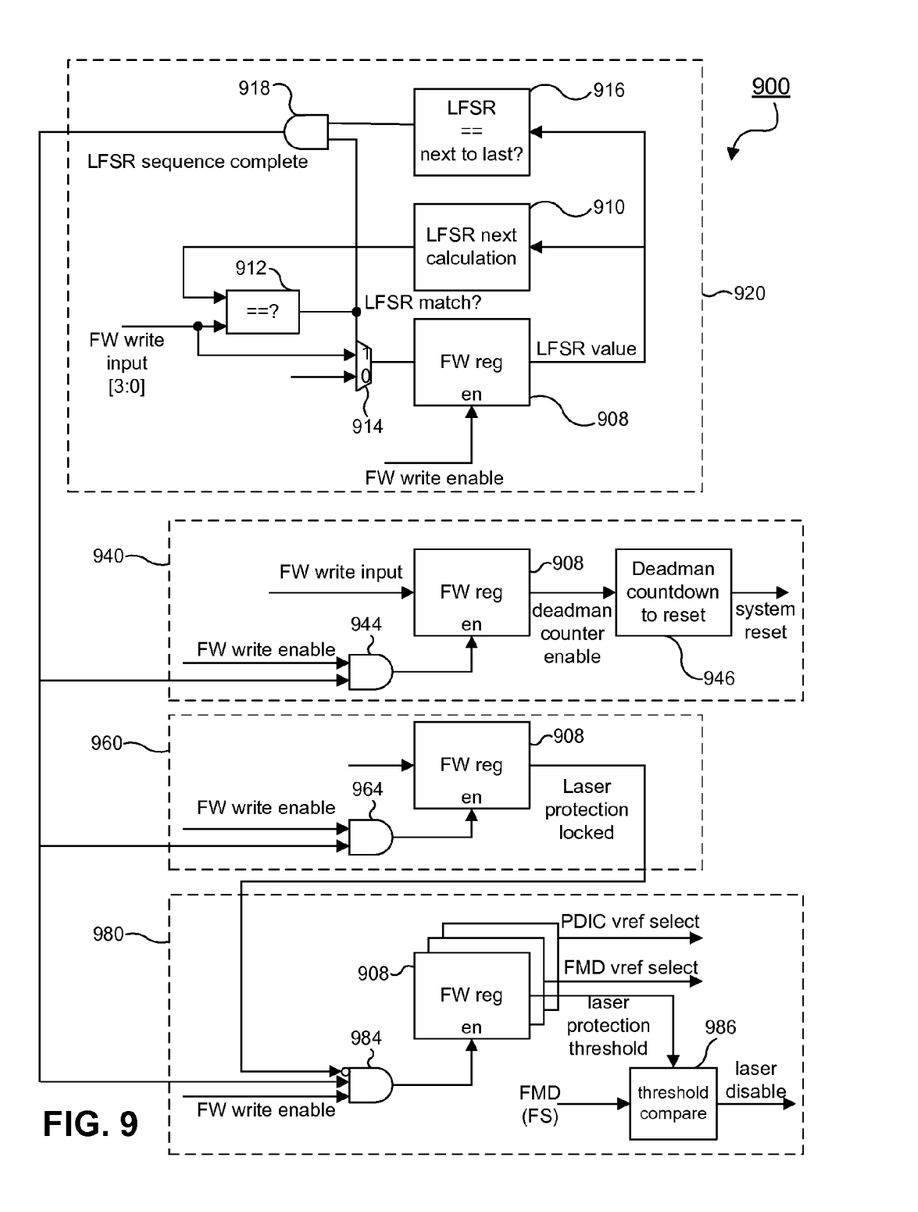
FIG. 9 is a block diagram showing a fault protection system, consistent with the present disclosure.

FIG. 9 is a block diagram showing a fault protection system 900, consistent with the present disclosure. Fault protection system 900 contains an LFSR circuit 920, a Deadman Counter enable circuit 940, a lock protection circuit 960, and a hardware parameter rewrite circuit 980.

LFSR circuit 920 comprises a firmware register 908, an LFSR hardware 910, an equal comparator 912, a comparator 914, an equal comparator 916, and an AND gate 918. Firmware register 908 is a protected register and may be read and written by the firmware. For illustrative purposes, the same firmware register 908 is presented multiple times, in circuits 940, 960, and 980. An embodiment of firmware register 908 is shown in FIG. 5.

Firmware register 908 has lower bits 3:0 for an LFSR value. Since the LFSR value has 4 bits, the period of the periodic sequence produced by LFSR circuit 920 is 15. In one embodiment, using the seed value is [0011], the periodic sequence is x={0011, 0111, 1111, 1110, 1101, 1010, 0101, 1011, 0110, 1100, 1001, 0010, 0100, 1000, 0001, ... }.

After power-on, the firmware writes the first number of the LFSR sequence to the lower four bits of firmware register 908. LFSR hardware 910 calculates the next LFSR number. Equal comparator 912 compares the next LFSR number from LFSR hardware 910 with the next input number by the firmware. If the numbers match, comparator 914 allows the firmware to write the next input number to the lower four bits of firmware register 908, and the process continues through the fifteen numbers in the LFSR sequence. If at any time the numbers do not match, however, comparator 914 will generate an input to reset firmware register 908 and the process restarts.

In addition, equal comparator 916 continuously compares the lower four bits of firmware register 908 with the next to the last number in the LFSR sequence. If these two numbers do not match, AND gate 918 generates a negative output and the higher bits of the firmware register 908 remain unlocked and may not be rewritten by the firmware, as shown in circuits 940, 960, and 980. On the other hand, if these two numbers match, AND gate 918 will check the other input from equal comparator 912 to see if the last LFSR number matches the last input number by the firmware. If the last LFSR number also matches the last input number by the firmware, AND gate 918 generates a positive output to circuits 940, 960, and 980.

Deadman Counter enable circuit 940 includes an AND gate 944 that receives one input from AND gate 918 and the other from a firmware write enable signal. If both of them are positive, AND gate 944 will enable write access to Deadman Counter enable field 560 (see FIG. 5). A firmware write input may then reset the Deadman Counter and the system. If any of the input of AND gate 918 is negative, the Deadman Counter may not be reset.

Similarly, lock protection circuit 960 includes an AND gate 964 that receives one input from AND gate 918 and the other from a firmware write enable signal. If both of them are positive, AND gate 964 will enable write access to Lock Indication field 520 (see FIG. 5). A firmware write input may write to the upper bits of firmware register 908, as the upper bits are unlocked. If any of the input of AND gate 918 is negative, firmware register 908 remains locked.

Hardware parameter rewrite circuit 980 also includes an AND gate 984 that receives one input from AND gate 918, one from a firmware write enable signal, and an inverse input from Lock Indication field 520 of firmware register 908 (see FIG. 5). If all three of the inputs are positive, AND gate 984 will enable write access to the laser protection threshold (e.g., FS Threshold field 520), FMD Vref Select field 540, and PDIC Vref Select field 550, as shown in FIG. 5). Either FMD Vref or PDIC Vref may be used on-chip and off-chip as a reference voltage.

Referring back to FIG. 9, after the laser protection threshold is set, a threshold comparator 986 will compare a reference voltage with the laser protection threshold and disable the laser if the reference voltage exceeds the laser protection threshold.

Figure 10:
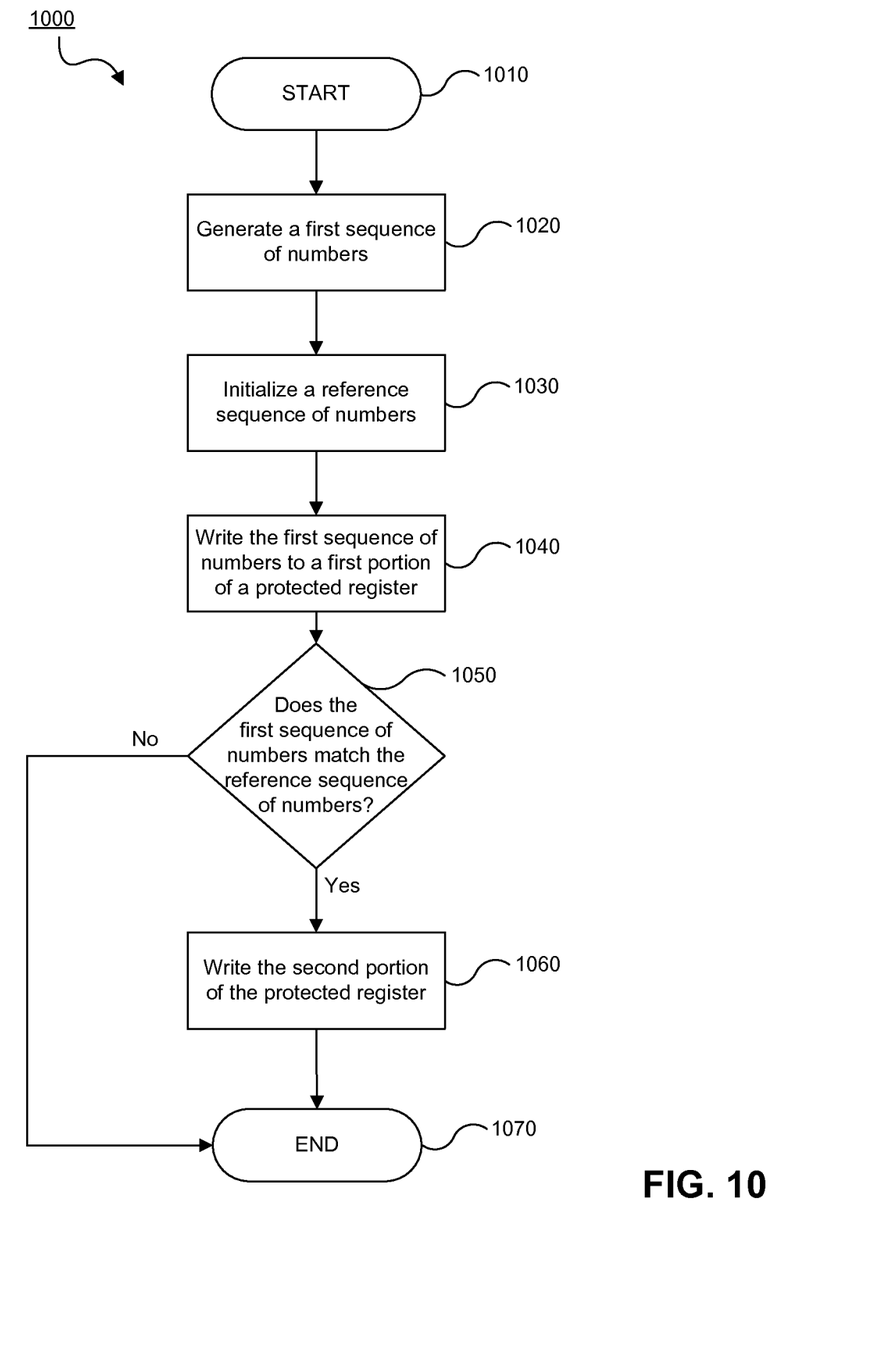
FIG. 10 is a flowchart showing an exemplary method for changing a hardware parameter using a linear feedback shift register, consistent with the present disclosure.

FIG. 10 is a flowchart showing an exemplary method 1000 for changing a hardware parameter using a linear feedback shift register, consistent with the present disclosure. After starting at step 1010, a fault protection system generates a first sequence of numbers at step 1020, using, for example, a firmware LFSR circuit. The fault protection system then initializes a reference sequence of numbers using, for example, a hardware LFSR circuit at step 1030. At step 1040, the firmware writes the first sequence of numbers to a first portion of a protected register, such as the lower four bits of the protected register.

The fault protection system then compares the first sequence of numbers with the reference sequence of numbers, one at a time, at step 1050. If the comparison is successful for all the numbers in the sequence, the protected register is unlocked and the firmware may write the higher bits of the protected register at step 1060. If, however, the comparison fails for any of the numbers in the sequence, the protected register remains locked and the process ends at step 1070. The fault protection system may restart the process.

In one embodiment, exemplary method 1000 includes performing a power-on test before starting the process at step 1010. In another embodiment, exemplary method 1000 includes storing the reference sequence of numbers in a reference register. The numbers in the sequence may have 4-bit values. In yet another embodiment, exemplary method 1000 includes writing a hardware parameter for a read laser power threshold in an optical drive such as a CD player, a CD/DVD combo player, a HD DVD player or a Blu-ray player. Exemplary method 1000 may also include shutting down the optical drive if a forward sense voltage exceeds the read laser power threshold.

Notably, the systems and methods disclosed herein are not inherently related to any particular computer or other apparatus, and may be implemented by a suitable combination of hardware, software, and/or firmware. Software implementations may include one or more computer programs. A computer program is a set of instructions readable and executable by a processor and can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network. Software may also be implemented as a computer program product, i.e., one or more computer programs tangibly embodied in an information carrier, e.g., in a machine-readable storage device, for execution by, or to control the operation of, data processing apparatus, e.g., a programmable processor, a computer, or multiple computers.

Other aspects of the disclosure will be apparent to those skilled in the art from consideration of the specification and practice of the aspects disclosed herein. It is intended that the specification and aspects disclosed herein be considered as exemplary in nature only.

What is claimed is:

1. A method comprising:
   generating, via a linear feedback shift register, a first sequence of numbers;
   writing the first sequence of numbers to a reference register;
   comparing the first sequence of numbers written to the reference register with a second sequence of numbers written to a first portion of a protected register, the protected register having a second portion in which protected data is stored; and
   enabling, responsive to the first sequence of numbers matching the second sequence of numbers, at least some of the protected data in the second portion of the protected register to be overwritten.

2. The method of claim 1 further comprising, prior to generating the first sequence of numbers, initializing the linear feedback shift register with an initial value.

3. The method of claim 1, wherein the linear feedback shift register is a first linear feedback shift register implemented via hardware and the second sequence of numbers is generated by a second linear feedback shift register implemented via firmware.

4. The method of claim 3, wherein the first linear feedback shift register and the second linear feedback shift register are initialized with a same value.

5. The method of claim 1, wherein each number of the first sequence of numbers comprises a 4-bit value and writing the first sequence of numbers comprises writing each 4-bit value of the first sequence of numbers to the reference register.

6. The method of claim 5, wherein writing each 4-bit value of the first sequence of numbers to the reference register comprises writing one of the 4-bit values over another of the 4-bit values previously written to the reference register.

7. The method of claim 1 further comprising, after the at least some of the protected data in the second portion of the protected register is overwritten, preventing a subsequent writing of data to the second portion of the protected register.

8. The method of claim 1 further comprising ceasing, responsive to the first sequence of numbers not matching the second sequence of numbers, the act of:
   generating the first sequence of numbers;
   writing the first sequence of numbers; or
   comparing the first sequence of numbers with the second sequence of numbers.

9. A circuit comprising logic implemented at least partially in hardware and configured to:
   receive a first sequence of numbers generated by a first linear feedback shift register;
   store the first sequence of numbers in a first portion of a protected register, the protected register having a second portion in which protected data is stored and to which writing of data is disabled;
   generate a second sequence of numbers via a second linear feedback shift register;
   compare the first sequence of numbers stored in the first portion of the protected register with the second sequence of numbers generated via the second linear feedback shift register; and
   enable, responsive to the first sequence of numbers matching the second sequence of numbers, the writing of data to the second portion of the protected register.

10. The circuit of claim 9 wherein the first linear feedback shift register is implemented via firmware and the second linear feedback shift register is implemented via the logic of the circuit.

11. The circuit of claim 9 further comprising subsequently disabling, responsive to data being written to the second portion of the protected register, the writing of data to the second portion of the protected register effective to prevent the data written to the second portion from being overwritten.

12. The circuit of claim 11, wherein the re-subsequent disabling of the writing of data into the second portion of the protected register is effective until power is removed from the circuit.

13. The circuit of claim 11, wherein the circuit is configured to cease, responsive to the first sequence of numbers not matching the corresponding one of the second sequence of numbers, the act of:
  receiving the first sequence of numbers;
  storing the first sequence of numbers; or
  comparing the first sequence of numbers with the second sequence of numbers.

14. The circuit of claim 11, wherein the circuit is implemented in an optical drive, the second portion of the protected register stores hardware parameters, and the act of enabling enables the hardware parameters to be written or overwritten by firmware of the optical drive.

15. One or more computer-readable memory devices storing processor-executable instructions that, responsive to execution by a processor, implement firmware to:
  implement a linear feedback shift register that is configured to generate pseudorandom numbers;
  initialize the linear feedback shift register with a seed value effective to cause the linear feedback shift register to generate, based on the seed value, a sequence of pseudorandom numbers;
  write the sequence of pseudorandom numbers to a first portion of a protected register for comparison with a reference sequence of numbers, the protected register having a second portion that is protected and configured to store hardware parameters;
  access to the second portion of the protected register being enabled if the sequence of pseudorandom numbers matches the reference sequence of numbers; and
  writing, responsive to an indication that access to the second portion of the protected register is enabled, the hardware parameters to the second portion of the protected register.

16. The one or more computer-readable memory devices of claim 15, wherein writing the hardware parameters to the second portion of the protected register is effective to disable subsequent writing to the protected register.

17. The one or more computer-readable memory devices of claim 15, wherein the seed value is a 4-bit number and the sequence of pseudorandom numbers comprises up to fifteen 4-bit pseudorandom numbers.

18. The one or more computer-readable memory devices of claim 15, wherein the hardware parameters are hardware parameters associated with a laser system of an optical drive.

19. The one or more computer-readable memory devices of claim 18, further comprising additional computer-executable instructions that, responsive to execution by the processor, implement the firmware to, responsive to receiving an indication of a fault condition of the laser system, cause a reset of the optical drive effective to clear the fault condition.

20. The one or more computer-readable memory devices of claim 15, wherein the reference sequence of numbers is generated by a hardware-based linear feedback shift register that is initialized with a same seed value.

* * * * *